United States Patent
Romero et al.

[11] Patent Number: 5,898,128
[45] Date of Patent: Apr. 27, 1999

[54] ELECTRONIC COMPONENT

[75] Inventors: Guillermo L. Romero, Chandler; Christopher M. Scanlan, Phoenix; David M. Gilbert, Scottsdale, all of Ariz.

[73] Assignee: Motorola, Inc., Schaumburg, Ill.

[21] Appl. No.: 08/712,037

[22] Filed: Sep. 11, 1996

[51] Int. Cl.⁶ .................................................. H05K 5/00
[52] U.S. Cl. ...................... 174/52.1; 174/52.4; 361/712
[58] Field of Search ................... 174/52.4, 52.2, 174/52.1; 361/813, 707, 737, 704, 712, 719, 720; 257/675, 696, 717, 709, 688, 701, 702, 703, 729, 779

[56] References Cited

U.S. PATENT DOCUMENTS

| | | |
|---|---|---|
| H1245 | 10/1993 | Griswold et al. . |
| 3,626,259 | 12/1971 | Garboushian et al. . |
| 3,628,105 | 12/1971 | Sakai et al. ............................. 257/664 |
| 3,777,221 | 12/1973 | Tatusko et al. . |
| 3,846,734 | 11/1974 | Pauza et al. . |
| 4,455,448 | 6/1984 | Bertolina . |
| 4,627,533 | 12/1986 | Pollard . |
| 4,773,955 | 9/1988 | Mabuchi et al. ......................... 156/257 |
| 4,837,664 | 6/1989 | Rodriguez, II et al. . |
| 4,903,169 | 2/1990 | Kitagawa et al. . |
| 5,111,277 | 5/1992 | Medeiros, III et al. . |
| 5,146,314 | 9/1992 | Pankove . |
| 5,294,750 | 3/1994 | Sakai et al. ............................. 174/52.4 |
| 5,412,340 | 5/1995 | Tanikoshi . |
| 5,418,329 | 5/1995 | Katoh et al. . |
| 5,461,196 | 10/1995 | Virga et al. . |
| 5,465,481 | 11/1995 | Romero . |
| 5,616,886 | 4/1997 | Romero et al. ......................... 174/52.4 |

*Primary Examiner*—Bot L. Ledynh
*Assistant Examiner*—Kristina Soderquist
*Attorney, Agent, or Firm*—George C. Chen; Kenneth M. Seddon

[57] ABSTRACT

An electronic component (10) has an electrically insulating substrate (20) that is encapsulated with an electrically conductive material (15) to provide thermal dissipation for the electronic component (10). The electrically insulating substrate (20) has cavities (21–24) that are either completely filled with an electrically conductive material (15) or are partially filled to provide recesses (26–27) for electronic devices (30,31). The electronic devices (30,31) are electrically coupled to the leads (60–63) of the electronic component (10) using either wire bonds (70) or metallic depositions (55–57).

18 Claims, 4 Drawing Sheets

ELECTRONIC COMPONENT

This invention is related to a co-pending application filed by Romero et al., which is assigned to the same assignee as the present invention. The application has a Ser. No. of 08/464,112 and was filed on Jun. 5, 1995, now U.S. Pat. No. 5,616,886.

BACKGROUND OF THE INVENTION

This invention relates, in general, to electronic components and, more particularly, to modules for mounting electronic components.

Some electronic components are used in high power or high current applications such as controllers for electric motors. Two of the most significant problems associated with these electronic components are the dissipation of heat generated by the electronic components and the protection of the electronic components from the harsh environment common to many high power or high current applications.

One previously known method of dissipating heat generated by electronic components is to mount the electronic components directly to a copper heatsink. Generally, such techniques are costly and introduce reliability problems due to the stress associated with mounting the electronic components to the heatsink.

To protect the electronic components from the harsh environments, an electronic component is formed by combining several electronic devices into a protective module. Typically, the protective module is formed from a complex sequence of molding operations that encapsulates the electronic devices within a combination of dielectric layers, conductive layers, and heat dissipation layers. Due to the complexity of the protective module, it is often very difficult to form reliable electrical connections between the electronic devices within the protective module. Furthermore, the process used to form the protective module is time consuming and costly.

By now it should be appreciated that it would be advantageous to provide an electronic component that not only provides adequate environmental protection and heat dissipating capability, but that is formed in fewer processing steps used to make conventional modules. It would also be advantageous if the process for making the electronic component provided options for forming the internal electrical connections between the electronic devices of the electronic component within the protective module.

Figure 1:
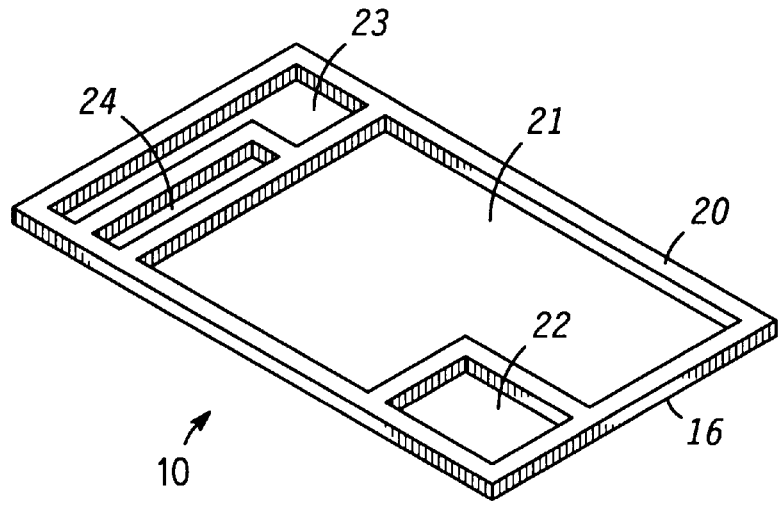
FIGS. 1–2 illustrate isometric views of an embodiment of an electronic component at various points during manufacturing in accordance with the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

FIG. 1 illustrates an isometric view of an embodiment of an electronic component 10 that includes a substrate 20. Substrate 20 has a top surface divided into a plurality of areas or cavities 21, 22, 23, and 24. Substrate 20 also has a bottom surface 16 opposite the top surface and a perimeter circumscribing bottom surface 16 and the top surface. Substrate 20 comprises an electrically insulating material such as a dielectric or a ceramic and can be molded or pressed using techniques known to those skilled in the art. Therefore, each of cavities 21–24 are electrically isolated from each other by the walls or partitions of substrate 20. The material used for substrate 20 should also be thermally conductive to facilitate the heat dissipation from component 10. As an example, substrate 20 can be comprised of a ceramic including, but not limited to, aluminum oxide, aluminum nitride, beryllium oxide, zirconia toughened alumina, silicon carbide, or other electrically insulating and thermally conductive ceramics commonly used in the art.

Figure 2:
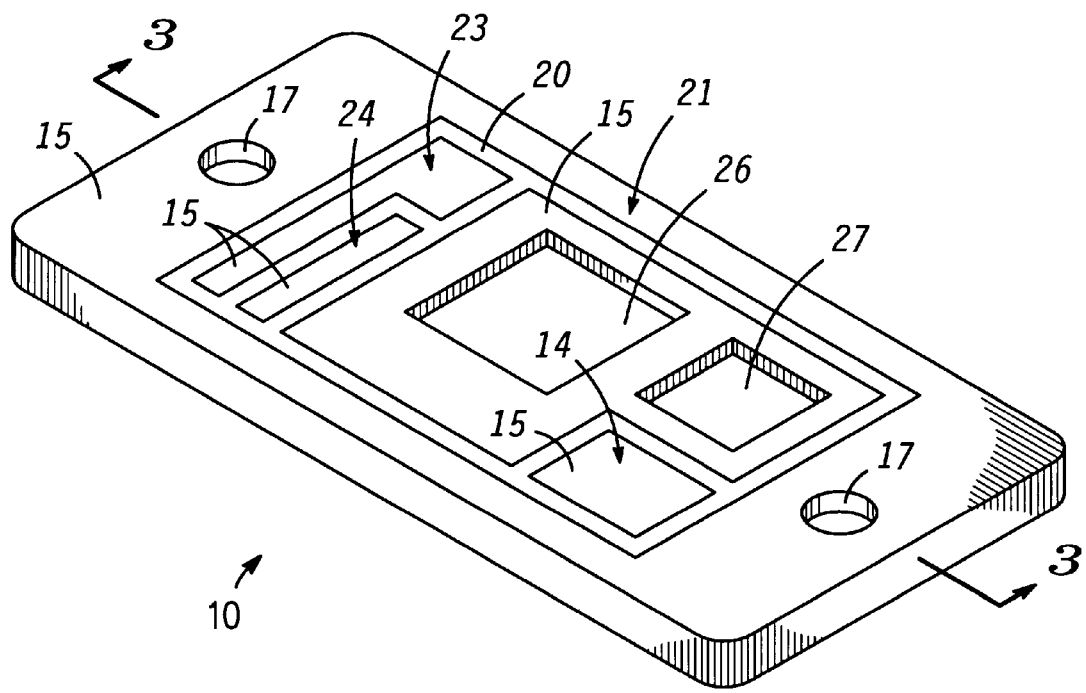
Figure 3:
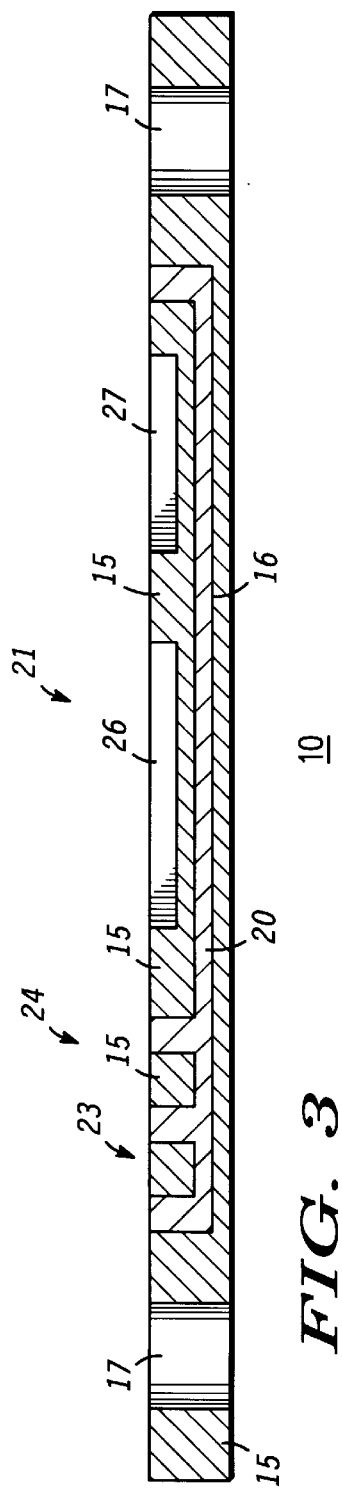
FIG. 3 depicts a cross-sectional view of the electronic component illustrated in FIG. 2 in accordance with the present invention.

FIG. 2 illustrates an isometric view of component 10 after a subsequent manufacturing step of molding an electrically conductive material 15 around substrate 20, and FIG. 3 depicts a cross-sectional view of component 10 taken along a sectional line 3—3 in FIG. 2. Material 15 is simultaneously molded or cast adjacent to or around the perimeter of substrate 20 using techniques known in the art to form a molded monolithic or unitary substrate having an electrically insulating layer and a electrically conductive layer. Material 15 is also simultaneously molded or cast adjacent to or contacting surface 16 and into portions of cavities 21–24. Portions of material 15 can have recesses such as recesses 26 and 27 that are located within cavity 21 and that are explained in more detail hereinafter. It is understood that cavity 21 can be deeper than either of recesses 26 and 27 so that a portion of material 15 is located at the bottom of recesses 26 and 27. Material 15 is also simultaneously molded over the top surface of substrate 20. However, this top portion of material 15 is subsequently removed by a grinding process, lapping process, or the like to expose a portion of the top surface of substrate 20 and to electrically isolate the portions of material 15 that are within cavities 21–24.

Material 15 is electrically conductive and is preferably metallic to facilitate electrical coupling of component 10. Accordingly, material 15 has a resistivity of less than approximately 20 microohms-centimeters. Preferably, material 15 has a resistivity less than about 5 microohms-centimeters to maximize the electrical performance of component 10. As an example, material 15 can be selected from a metal or metal alloy comprising aluminum, zirconia toughened aluminum (ZTA), copper, silver, titanium, nickel, chrome, molybdenum, platinum, or other metals typically used for electrical coupling. The preferred composition of material 15 is dependent upon the composition of substrate 20. In particular, the coefficient of thermal expansion (CTE) of material 15 should be substantially similar to the CTE of substrate 20 to avoid significant thermal stresses within component 10. For example, when substrate 20 is comprised of aluminum nitride, substrate 20 has a CTE of approximately 4.5 parts per million per degree Celsius (ppm/°C.). In this embodiment, suitable metals for material 15 include aluminum, copper, and ZTA that each have a CTE of approximately 22 ppm/°C., 17 ppm/°C., and 4.5 ppm/°C., respectively.

In the prior art, material 15 is typically comprised of a metal matrix composite such as aluminum infiltrated silicon carbide. However, metal matrix composite materials have higher resitivities than materials that consist essentially of metals or metal alloys. Accordingly, material 15 improves the electrical performance and reduces the manufacturing complexity and cost for component 10 compared to the prior art.

An outer portion of material 15 is also molded or cast to form a plurality of mounting holes 17 to facilitate the mounting of component 10 to an assembly substrate, a heat sink, or the like. Holes 17 and the outer portion of material 15 can have intimate contact and improved thermal contact with an assembly substrate or heat sink when material 15 is comprised of a malleable metal such as, for example, aluminum.

Figure 4:
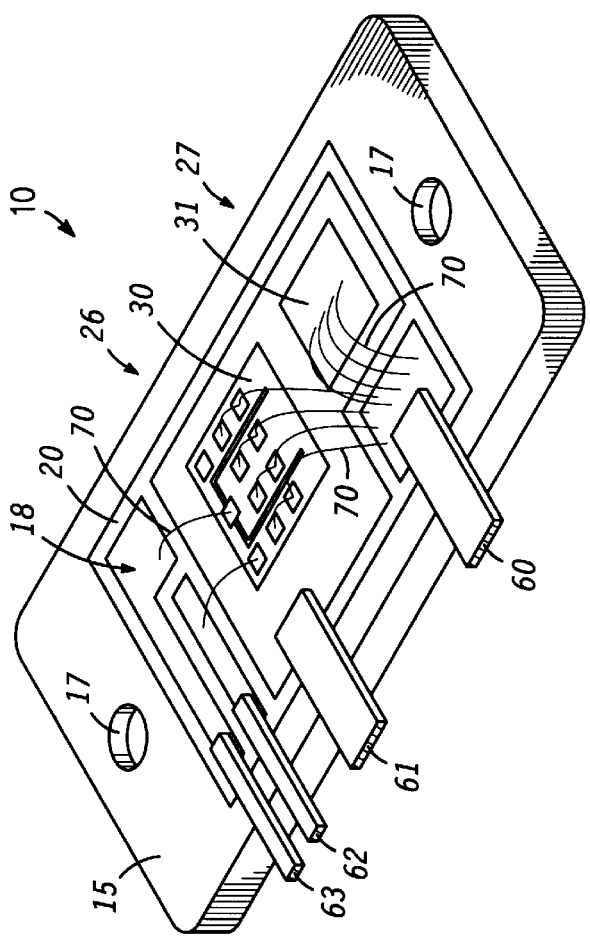
FIG. 4 illustrates an isometric view of the electronic component after subsequent manufacturing to form electrical connections in accordance with the present invention.

FIG. 4 illustrates an isometric view of component 10 after subsequent manufacturing. Electronic devices 30 and 31 are located, positioned, or mounted within recesses 26 and 27, respectively, by any convenient means including, but not limited to, using a solder or conductive adhesive. Therefore, the back surfaces of devices 30 and 31 overlie, are thermally coupled, and are electrically coupled to the portion of material 15 within cavity 21. For illustrative purposes only, devices 30 and 31 are a semiconductor transistor and a diode, respectively. Alternatively, devices 30 and 31 can also be integrated circuits or other electronic devices. In the illustrated embodiment of FIG. 4, the top surface of substrate 20, material 15, and devices 30 and 31 form a substantially planar surface 18. In an alternative embodiment to improve heat spreading within component 10, material 15 does not have recess 26 or 27, and devices 30 and 31 are mounted over a planar surface formed by material 15 and substrate 20. In this alternative embodiment, the molded substrate comprising material 15 and substrate 20 can be processed using standard printed wiring board assembly methods.

A plurality of electrical leads 60, 61, 62, and 63 overlie substrate 20 and are affixed to the different portions of material 15 located in cavities 22, 21, 24, and 23. Each of leads 60–63 are electrically isolated from the portion of material 15 located around the perimeter of substrate 20 so that each of leads 60–63 are electrically isolated from each other. Leads 60–63 can be attached by any convenient process, including but not limited to spot welding, soldering, etc. and the different portions of material 15 electrically couple wire bonds 70 to leads 60–63. Leads 60–63 can molded within a plastic housing, and the plastic housing can be attached to the molded substrate.

Then, a plurality of wire bonds 70 can be used to electrically couple devices 30 and 31 directly to leads 60–63. Alternatively, as shown in FIG. 4, wire bonds 70 can be used to electrically couple devices 30 and 31 indirectly to leads 60–63 via different portions of material 15 within cavities 21–24. In this alternative embodiment, material 15 serves as an interconnect layer or electrical conductor as well as a mounting structure and heat spreader for component 10. In this example, leads 60–63 are described as being formed separately and attached before the wire bonding of devices 30 and 31. However, it is understood that leads 60–63 can alternatively be attached after the wire bonding of devices 30 and 31 when wire bonds 70 do not directly or physically contact any of leads 60–63.

Figure 5:
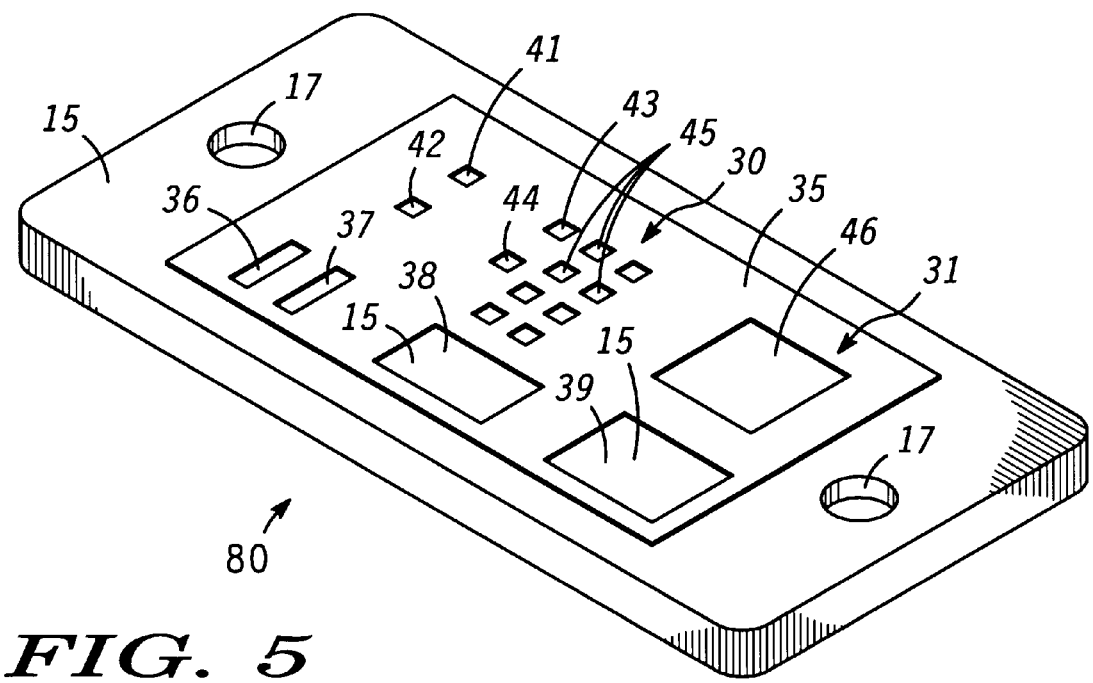
FIGS. 5–8 portray isometric views of an alternative embodiment of the electronic component at various points during manufacturing to form electrical connections in accordance with the present invention.

FIGS. 5–8 portray isometric views of an electronic component 80 at various points during manufacturing to form electrical connections. Component 80 is an alternative embodiment of component 10 in FIG. 4 and does not use wire bonds for the electrical coupling of devices 30 and 31. FIG. 5 continues from FIG. 2. A layer 35 is deposited or positioned over substrate 20 so as to cover all of devices 30 and 31 and material 15 within cavities 21–24. As will be explained presently, layer 35 will remain in the finished structure and should be selected with characteristics such that it will not be damaged during later manufacturing steps. As a typical example, layer 35 can include or be formed of standard photoresist or polyimide photoresist. Alternatively, layer 35 can be a dielectric layer including silicon oxide or silicon nitride.

A plurality of openings 36, 37, 38, 39, 41, 42, 43, 44, 45, and 46 are formed through layer 35, as illustrated in FIG. 5, so as to expose surfaces of portions of material 15 in cavities 21–24 and to expose connections to devices 30 and 31. Specifically, in this example, openings 36, 37, 38 and 39 are formed to expose portions of the surfaces of material 15 in cavities 23, 24, 21 and 22, respectively. A pair of spaced apart openings 41 and 42 are formed through layer 35 so as to expose the surface of a portion of material 15 in cavities 23 and 24, respectively. A second pair of openings 43 and 44 are formed in spaced relationship to openings 41 and 42 and in overlying relationship to connections on device 30. A plurality of openings 45 (eight) are formed through layer 35 overlying device 30 so as to expose additional connections of device 30. Also, an opening 46 is formed through layer 35 so as to expose a connection to the upper surface of device 31. It will of course be understood that layer 35 and the openings therethrough can be formed in a variety of processes including but not limited to the well known and relatively simple process of masking, exposing, and removing the exposed areas if layer 35 is a photoresist material.

As will be described in more detail presently, openings 36–39 define external terminals for component 80 and, therefore, are relatively large so that a relatively large electrical connection can be made thereto. Also, it can be seen by referring back to FIG. 2 that material 15 in cavity 23 connects opening 41 to opening 36 and material 15 in cavity 24 connects opening 42 to opening 37. Further, as will be seen presently, material 15 in cavity 22 serves as a connection pad, as well as an external terminal.

Figure 6:
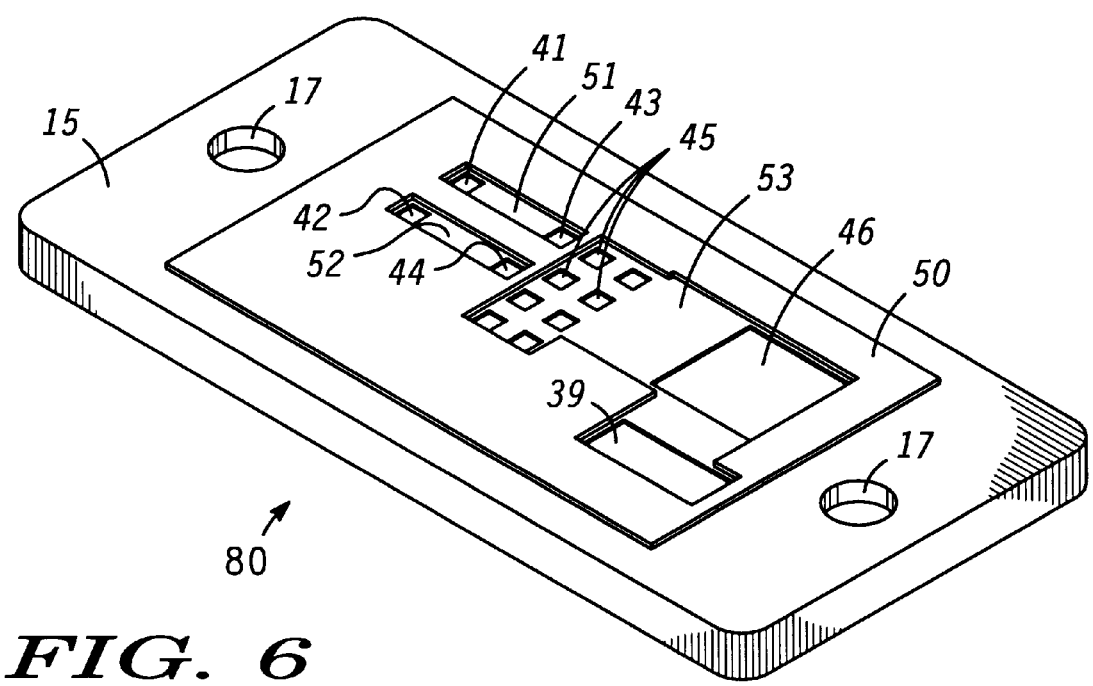

The next step in the process, as illustrated in FIG. 6, includes placing a conductor plating mask 50 over layer 35 so as to leave exposed appropriate surface areas of layer 35 and the openings therethrough. Specifically, mask 50 has an opening 51 exposing openings 41 and 43 in layer 35 and the portion of layer 35 extending therebetween, a second opening 52 exposing openings 42 and 44 in layer 35 and the portion of layer 35 extending therebetween, and a large third opening 53 exposing openings 45, 46 and a portion of 39 through layer 35 and the portion of layer 35 therebetween. An interconnect metal such as aluminum, copper, gold, titanium, tungsten, or the like is then deposited on the exposed surface areas by any convenient process including, but not limited to, vapor deposition, electroplating, electroless plating, sputtering, or flame spraying. Mask 50 and any extraneous metal is then removed to pattern the interconnect metal and to leave the electrical interconnects illustrated in FIG. 7.

Figure 7:
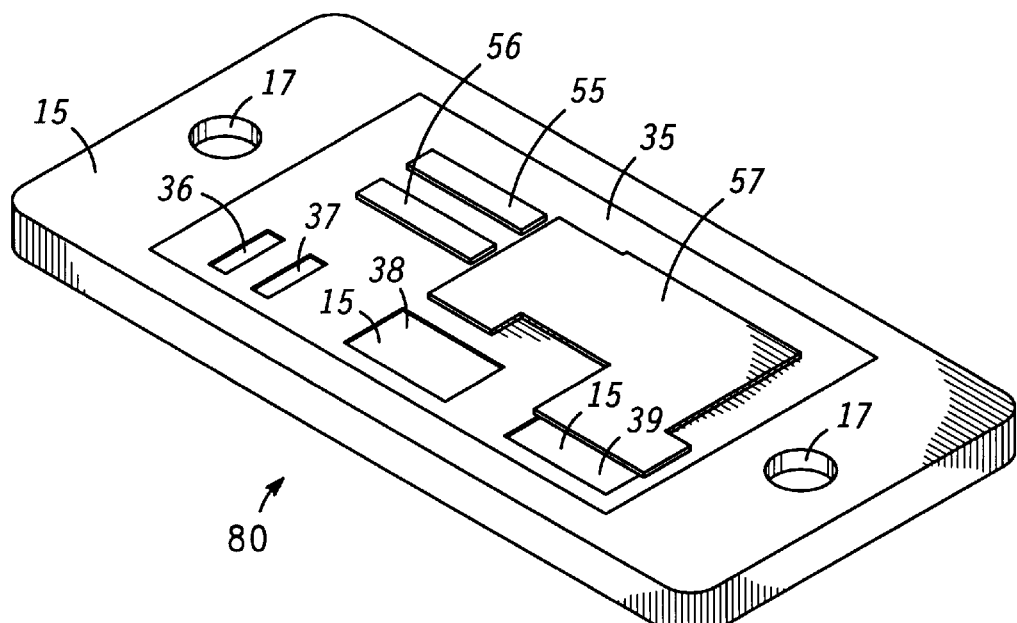

As can be seen by referring to FIGS. 6 and 7, a strip 55 of interconnect metal is formed by opening 51 in mask 50. Furthermore, a strip 56 of interconnect metal extends across opening 52, and a relatively large patch or strip 57 of interconnect metal is formed by opening 53. Strip 55 electrically connects device 30 through opening 43 to material 15 in cavity 23, a portion of which is exposed to define an external terminal at opening 36. Strip 56 electrically connects device 30 through opening 44 to material 15 in cavity 24, a portion of which is exposed to define an external terminal at opening 37. Strip 57 interconnects device 30 through openings 45 device 31 through opening 46 and, further, connects devices 30 and 31 to material 15 in cavity 22, a portion of which is exposed to define an external terminal in opening 39.

Figure 8:
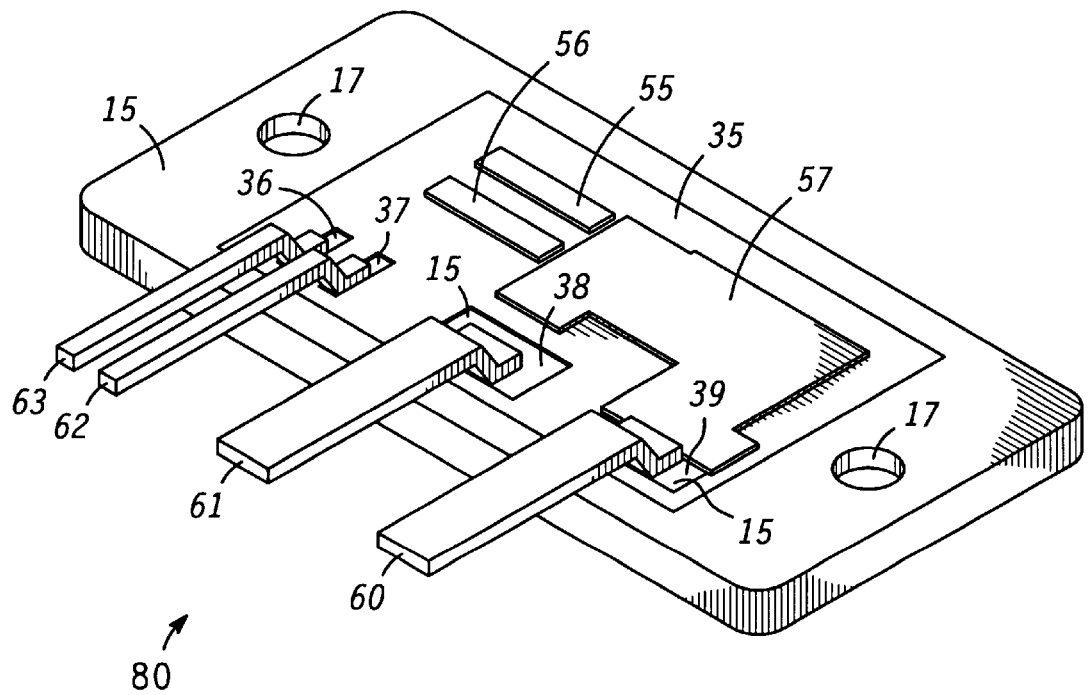

Referring now to FIG. 8, leads 60–63 are affixed to the exposed portions of material 15 in openings 36–39, respectively. Leads 60–63 are similar to leads 60–63 of component 10 in FIG. 4.

By now it should be appreciated that the present invention provides a novel electronic component and a method of making the same. One advantage of the present invention is that heat dissipation for electronic component 10 is provided by electrically conductive material 15, which is easier to form than the heatsinks of some previously known modules. In a single molding operation, electrically conductive material 15 is formed around substrate 20. At the same time, electrically conductive material 15 is formed within cavities 21–24 of substrate 20. Thus, heat dissipation is provided for electronic devices 30 and 31 using a process that is simplified and less expensive than some previously known process used for forming modules. Furthermore, the portions of electrically conductive material 15 that are used to provide internal electrical connections of electronic component 10, also provide additional heat dissipation capability for electronic devices 30 and 31.

Another advantage of the present invention is that it can also be used to encapsulate a single electronic device. For example, a substrate could have only one cavity which is used to contain a single electronic device. Wire bonds or metallic depositions would then be used to electrically couple the electronic device to external leads. Electrically conductive layers around the substrate and in the cavity of the substrate would provide excellent thermal dissipation for the single electronic device.

As described above, the present invention provides two methods of forming internal electrical connections between electronic devices 30 and 31 (e.g., wire bonds 70 in component 10 or strips 55–57 of metallic depositions in component 80). This flexibility allows the present invention to be incorporated into various manufacturing process without added cost or complexity. The present invention also obviates the need to form complex ceramic matrices to provide heat dissipation as is done in the art. Therefore, the flexibility and simplified manufacturing process of the present invention allows electronic components to be formed in less time and with substantially lower assembly costs.

While the invention has been particularly shown and described with reference to preferred embodiments, it will be understood by those skilled in the art that changes in form and detail may be made without departing from the spirit and scope of the invention. For instance, the numerous details set forth herein such as, for example, the specific compositions of material 15 and substrate 20 and the specific sizes and shapes of cavities 21–24 are provided to facilitate the understanding of the present invention and are not provided to limit the scope of the invention. Furthermore, the material in cavities 21–24 can be different from the material around the perimeter of substrate 20. As an example, instead of forming material 15 from a single material, the material in cavities 21–24 can be metallic preforms or the like, and the material around the perimeter of substrate 20 can be molded or cast from a material different from the material in cavities 21–24. Accordingly, the disclosure of the present invention is not intended to be limiting. Instead, the disclosure of the present invention is intended to be illustrative of the scope of the invention, which is set forth in the following claims.

We claim:

1. An electronic component comprising:
    an electrically insulating substrate having a first surface, a second surface opposite the first surface, and a side surface forming a perimeter circumscribing the first surface, the first surface having a cavity;
    a first electrically conductive material physically contacting at least a portion of the side surface wherein the first electrically conductive material has a resistivity of less than approximately 20 microohms-centimeters and wherein the first electrically conductive material physically contacts the entire perimeter of the electrically insulating substrate;
    a second electrically conductive material in the cavity wherein the second electrically conductive material has a resistivity of less than approximately 20 microohms-centimeters wherein the first and second electrically conductive materials are formed from the same material;
    an electronic device overlying the second electrically conductive material; and
    a plurality of leads electrically coupled to the electronic device.

2. The electronic component of claim 1 wherein the second electrically conductive material has a recess and wherein the electronic device is located in the recess.

3. The electronic component of claim 2 wherein a top surface of the electronic device and the first surface of the electrically insulating substrate are substantially coplanar.

4. The electronic component of claim 1 wherein a ton surface of the electronic device and the first surface of the electrically insulating substrate form a substantially planar surface and further comprising metallic depositions overlying the substantially planar surface and extending between the electronic device and the plurality of leads, the metallic depositions providing electrical interconnections between the electronic device and the plurality of leads.

5. The electronic component of claim 1 wherein the first and second electrically conductive materials are formed simultaneously from a single material.

6. The electronic component of claim 1 wherein the electronic device is thermally coupled to the second electrically conductive material.

7. The electronic component of claim 1 wherein the plurality of leads is electrically isolated from the first electrically conductive material.

8. The electronic component of claim 1 further comprising a plurality of wire bonds electrically coupling the electronic device to the plurality of leads.

9. The electronic component of claim 1 wherein first electrically conductive material is selected from the group consisting of aluminum, copper, silver, titanium, nickel, chrome, molybdenum, or platinum.

10. The electronic component of claim 1 wherein the electrically insulating substrate comprises a ceramic selected from the group consisting of aluminum oxide, aluminum nitride, beryllium oxide, or zirconia toughened alumina.

11. The electronic component of claim 1 wherein the resistivity of the first electrically conductive material is less than about 5 microohms-centimeters.

12. The electronic component of claim 11 wherein the resistivity of the second electrically conductive material is less than about 5 microohms-centimeters.

13. The electronic component of claim 1 wherein the first electrically conductive material overlies at least a portion of the side surface of the electrically insulating substrate.

14. The electronic component of claim 1 further comprising a plurality of wire bonds electrically coupling the electronic device and the plurality of leads.

15. An electronic component comprising:
   a dielectric substrate having a first surface opposite a second surface and a side surface around a perimeter of the first surface, the first surface having a cavity;
   a metallic material overlying at least a portion of the side surface and located in the cavity and around the perimeter of the dielectric substrate wherein the metallic material around the perimeter of the dielectric substrate has a plurality of mounting holes;
   a semiconductor device overlying the molded metallic material and overlying the cavity;
   a plurality of electrical leads overlying the dielectric substrate; and
   a plurality of wire bonds electrically coupling the semiconductor device and the plurality of electrical leads.

16. The electronic component of claim 15 wherein the metallic material contacts the second surface.

17. The electronic component of claim 15 wherein the first surface of the dielectric substrate and a top surface of the semiconductor device are substantially coplanar.

18. The electronic component of claim 15 wherein the metallic material physically contacts at least a portion of the side surface.

* * * * *

UNITED STATES PATENT AND TRADEMARK OFFICE
CERTIFICATE OF CORRECTION

PATENT NO. : 5,898,128
DATED : April 27, 1999
INVENTOR(S) : Guillermo L. Romero et al.

Page 1 of 1

It is certified that error appears in the above-identified patent and that said Letters Patent is hereby corrected as shown below:

<u>Column 6,</u>
Line 33, delete "ton" and add -- top --.

Signed and Sealed this

Thirtieth Day of April, 2002

Attest:

Attesting Officer

JAMES E. ROGAN
*Director of the United States Patent and Trademark Office*